US011560621B2

United States Patent
Hong

(10) Patent No.: US 11,560,621 B2
(45) Date of Patent: Jan. 24, 2023

(54) MASK SET FOR DEPOSITION AND METHOD OF MANUFACTURING DISPLAY PANEL USING THE SAME

(71) Applicant: SAMSUNG DISPLAY CO., LTD., Yongin-si (KR)

(72) Inventor: Jaemin Hong, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 424 days.

(21) Appl. No.: 16/788,185

(22) Filed: Feb. 11, 2020

(65) Prior Publication Data

US 2020/0181767 A1    Jun. 11, 2020

Related U.S. Application Data

(62) Division of application No. 14/968,746, filed on Dec. 14, 2015, now Pat. No. 10,563,301.

(30) Foreign Application Priority Data

Mar. 31, 2015   (KR) ........................ 10-2015-0045661

(51) Int. Cl.
    *C23C 16/04*      (2006.01)
    *H01L 51/00*      (2006.01)
    (Continued)

(52) U.S. Cl.
    CPC .......... *C23C 16/042* (2013.01); *C23C 14/042* (2013.01); *H01L 51/0011* (2013.01);
    (Continued)

(58) Field of Classification Search
    None
    See application file for complete search history.

(56) References Cited

U.S. PATENT DOCUMENTS 10,563,301 B2 *   2/2020   Hong .................... C23C 16/042
2008/0290794 A1   11/2008  Yuasa
(Continued)

FOREIGN PATENT DOCUMENTS

CN          104009066 A      8/2014
KR     10-2005-0015163 A     2/2005
(Continued)

OTHER PUBLICATIONS

Kajiyama, Y., "New Color Patterning Techniques for OLED Display", dissertation Electrical and Computer Engineering, University of Waterloo, Ontario Canada (2015). (Year: 2015).*

(Continued)

*Primary Examiner* — J. E. Schoenholtz
(74) *Attorney, Agent, or Firm* — Lewis Roca Rothgerber Christie LLP

(57) ABSTRACT

A deposition mask set includes a first mask, a second mask, and a third mask. Each of the first mask, second, and third masks includes a first edge substantially parallel to a first direction, a second edge substantially parallel to a second direction, and a plurality of first openings. Each of the openings includes a first opening side that is substantially parallel to a third direction and a second opening side that is substantially parallel to a fourth direction, and each of the openings corresponds to one of a first, second, or third color area at one of pixel areas. The third and fourth directions are not parallel to the first and second directions, and the first, second, and third color areas are adjacent to each other in the third direction.

7 Claims, 11 Drawing Sheets

(51) Int. Cl.
*C23C 14/04* (2006.01)
*H01L 51/56* (2006.01)
*H01L 27/32* (2006.01)

(52) U.S. Cl.
CPC ...... *H01L 51/0012* (2013.01); *H01L 51/0023* (2013.01); *H01L 51/56* (2013.01); *H01L 27/3218* (2013.01)

(56) References Cited

U.S. PATENT DOCUMENTS

| | | | |
|---|---|---|---|
| 2011/0174957 A1* | 7/2011 | Okada | H01L 27/14603 250/208.1 |
| 2013/0337597 A1 | 12/2013 | Kawato et al. | |
| 2014/0319484 A1 | 10/2014 | Kwon | |
| 2015/0011033 A1 | 1/2015 | Ko | |
| 2015/0021637 A1 | 1/2015 | Ahn et al. | |
| 2015/0102297 A1 | 4/2015 | Lee | |
| 2015/0287922 A1* | 10/2015 | Chen | C23C 14/24 118/727 |
| 2015/0348455 A1 | 12/2015 | Jeon et al. | |
| 2016/0329385 A1 | 11/2016 | Qiu et al. | |
| 2016/0358985 A1* | 12/2016 | Bai | H01L 27/326 |
| 2018/0019287 A1* | 1/2018 | Zhang | H01L 27/3218 |

FOREIGN PATENT DOCUMENTS

| | | |
|---|---|---|
| KR | 10-2015-0139131 | 12/2015 |
| WO | WO 2015/101328 A1 | 7/2015 |
| WO | WO 2016/115862 A1 | 7/2016 |

OTHER PUBLICATIONS

Pentile OLEDs: Introduction and market status, OLED-Info, Feb. 10, 2019, downloaded from URL<https://www.oled-info.com/pentile> on May 23, 2022 (Year: 2019).*

* cited by examiner

MASK SET FOR DEPOSITION AND METHOD OF MANUFACTURING DISPLAY PANEL USING THE SAME

CROSS-REFERENCE TO RELATED APPLICATION

This application is a divisional of U.S. patent application Ser. No. 14/968,746, filed Dec. 14, 2015, which claims priority to and the benefit of Korean Patent Application No. 10-2015-0045661, filed Mar. 31, 2015, the entire content of both of which is incorporated herein by reference.

BACKGROUND

1. Field

The present disclosure relates to a mask set for deposition and a method of manufacturing a display panel using the mask set.

2. Description of the Related Art

In general, a flat panel display or a semiconductor device is manufactured by depositing various materials on a substrate. A deposition process is carried out using a deposition mask. The materials deposited on the substrate form a thin film layer pattern.

In recent years, a density of the thin film pattern has become high according to a high-density integration of the semiconductor device and a high-resolution of the flat panel display.

An organic light emitting display device is widely used as the flat panel display. The organic light emitting display device includes an organic light emitting device including an anode, an organic light emitting layer, and a cathode. In this case, holes and electrons injected into the organic light emitting layer are recombined in the organic light emitting layer to generate excitons, and the organic light emitting display device emits light by the excitons that return to a ground state from an excited state. The organic light emitting display device displays an image using the light emission of the organic light emitting layer.

The organic light emitting display device has a self-emissive characteristic and does not need a separate light source, and thus a thickness and a weight of the organic light emitting display device may be relatively reduced. In addition, because the organic light emitting display device has various features, such as low power consumption, high brightness, fast response time, etc., the organic light emitting display device is considered as a next generation display device.

SUMMARY

The present disclosure provides a mask set for deposition, which may have improved strength.

The present disclosure provides a method of manufacturing a display panel using the mask set.

One or more embodiments of the inventive concept provide a deposition mask set including a first mask. The first mask includes a first edge substantially parallel to a first direction, a second edge substantially parallel to a second direction, and a plurality of first openings, each of the first openings including a first opening side that is substantially parallel to a third direction and a second opening side that is substantially parallel to a fourth direction, and each of the first openings corresponding to a first color area at one of pixel areas, wherein the pixel areas are in a matrix form along the first and second directions, wherein each of the pixel areas comprises a first area side that is substantially parallel to the third direction and a second area side that is substantially parallel to the fourth direction, and wherein the third and fourth directions are not parallel to the first and second directions.

In one or more embodiments, the first mask may include a first section, a number of first sub-openings in the first section from among the first openings being less than a number of second sub-openings in the first section from among the first openings, wherein the first and second sub-openings are overlapped with first and second pixel definition lines, respectively, the first and second pixel definition lines being substantially parallel to the third direction and overlapping with the first section, and wherein the second pixel definition line is adjacent to the first pixel definition line in the fourth direction.

In one or more embodiments, the deposition mask may further include a second section adjacent to the first section in the fourth direction. A number of third sub-openings in the second section from among the first openings being equal to a number of fourth sub-openings in the second section from among the first openings, wherein the third and fourth sub-openings are overlapped with third and fourth pixel definition lines, respectively, the third and fourth pixel definition lines being substantially parallel to the third direction and overlapping with the second section, and wherein the fourth pixel definition line is adjacent to the third pixel definition line in the fourth direction.

In one or more embodiments, the deposition mask set may further include a third section adjacent to the second section in the fourth direction. A number of fifth sub-openings in the third section from among the first openings being greater than a number of sixth sub-openings in the third section from among the first openings, wherein the fifth and sixth sub-openings are overlapped with fifth and sixth pixel definition lines, respectively, the fifth and sixth pixel definition lines being substantially parallel to the third direction and overlapping with the third section, and wherein the sixth pixel definition line is adjacent to the fifth pixel definition line in the fourth direction.

In one or more embodiments, the first and second directions may be substantially perpendicular to each other and the third and fourth directions may be substantially perpendicular to each other.

In one or more embodiments, the first and third directions form an angle of about 45 degrees.

In one or more embodiments, the deposition mask set may further include a second mask. The second mask includes a third edge substantially parallel to the first direction, a fourth edge substantially parallel to the second direction, and a plurality of second openings, each of the second openings including a third opening side that is substantially parallel to the third direction and a fourth opening side that is substantially parallel to the fourth direction, each of the second openings corresponding to a second color area and each second color area at one of the pixel areas, and wherein the second color area is adjacent to the first color area in the third direction.

In one or more embodiments, the deposition mask set may further include a third mask. The third mask includes a fifth edge substantially parallel to the first direction, a sixth edge substantially parallel to the second direction, and a plurality of third openings, each of the third openings including a fifth opening side that is substantially parallel to the third direction and a sixth opening side that is substantially parallel to the fourth direction, each of the third openings corresponding to a third color area at one of the pixel areas, and wherein the third color area is adjacent to the second color area in the third direction.

In one or more embodiments, the first, second, and third color areas of each of the pixel areas may not overlap with each other.

In one or more embodiments, centers of the first, second, and third color areas of each of the pixel areas may be aligned in the third direction.

In one or more embodiments, a length of the first opening side may be different from a length of at least one of the third and fifth opening sides.

In one or more embodiments, a length of the second, fourth, and sixth opening sides may be the same.

One or more embodiments of the inventive concept provide a method of manufacturing a display panel, the method including: preparing a substrate including a display part including first and second display sides that are substantially parallel to first and second directions, respectively; defining a plurality of pixel areas on the substrate, the pixel areas being arranged in a matrix form along the first and second directions, each of the pixel areas including first and second area sides that are substantially parallel to third and fourth directions, respectively, the third and fourth directions being not parallel to the first and second directions; and depositing a first color material on the substrate using a first mask to form a first color layer in a first color area of each of the pixel areas, wherein the first mask includes a first opening corresponding to the first color area of each of the pixel areas and includes first and second opening sides substantially parallel to the third and fourth directions, respectively.

In one or more embodiments, the method may further include depositing a second color material on the substrate using a second mask to form a second color layer in a second color area of each of the pixel areas, wherein the second mask includes a second opening corresponding to the second color area and includes third and fourth opening sides substantially parallel to the third and fourth directions, respectively, and the second color area is adjacent to the first color area in the third direction.

In one or more embodiments, the method may further include depositing a third color material on the substrate using a third mask to form a third color layer in a third color area of each of the pixel areas, wherein the third mask includes a third opening corresponding to the third color area and includes fifth and sixth opening sides substantially parallel to the third and fourth directions, respectively, and the third color area is adjacent to the second color area in the third direction.

In one or more embodiments, the substrate may include a first area, a number of first pixel areas in the first area from among the pixel areas being less than a number of second pixel areas in the first area from among the pixel areas, wherein the first and second pixel areas are overlapped with first and second pixel definition lines, respectively, the first and second pixel definition lines being substantially parallel to the third direction and overlapped with the first area, and wherein the second pixel definition line is adjacent to the first pixel definition line in the fourth direction.

In one or more embodiments, the substrate may include a second area adjacent to the first area in the fourth direction, a number of third pixel areas in the second area from among the pixel areas being equal to a number of fourth pixel areas in the second area from among the pixel areas, wherein the third and fourth pixel areas are overlapped with third and fourth pixel definition lines, respectively, the third and fourth pixel definition lines being substantially parallel to the third direction and overlapped with the second area, and wherein the fourth pixel definition line is adjacent to the third pixel definition line in the fourth direction.

In one or more embodiments, the substrate may include a third area adjacent to the second area in the fourth direction, a number of fifth pixel areas in the third area from among the pixel areas being greater than a number of sixth pixel areas in the third area from among the pixel areas, wherein the fifth and sixth pixel areas are overlapped with fifth and sixth pixel definition lines, respectively, the fifth and sixth pixel definition lines being substantially parallel to the third direction and overlapped with the third area, and wherein the sixth pixel definition line is adjacent to the fifth pixel definition line in the fourth direction.

According to the above, the strength of the masks may be improved by the shapes and arrangements of the openings of the masks. As such, the density of the openings of the masks may be improved. Thus, the display panel manufactured using the masks may have high resolution.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
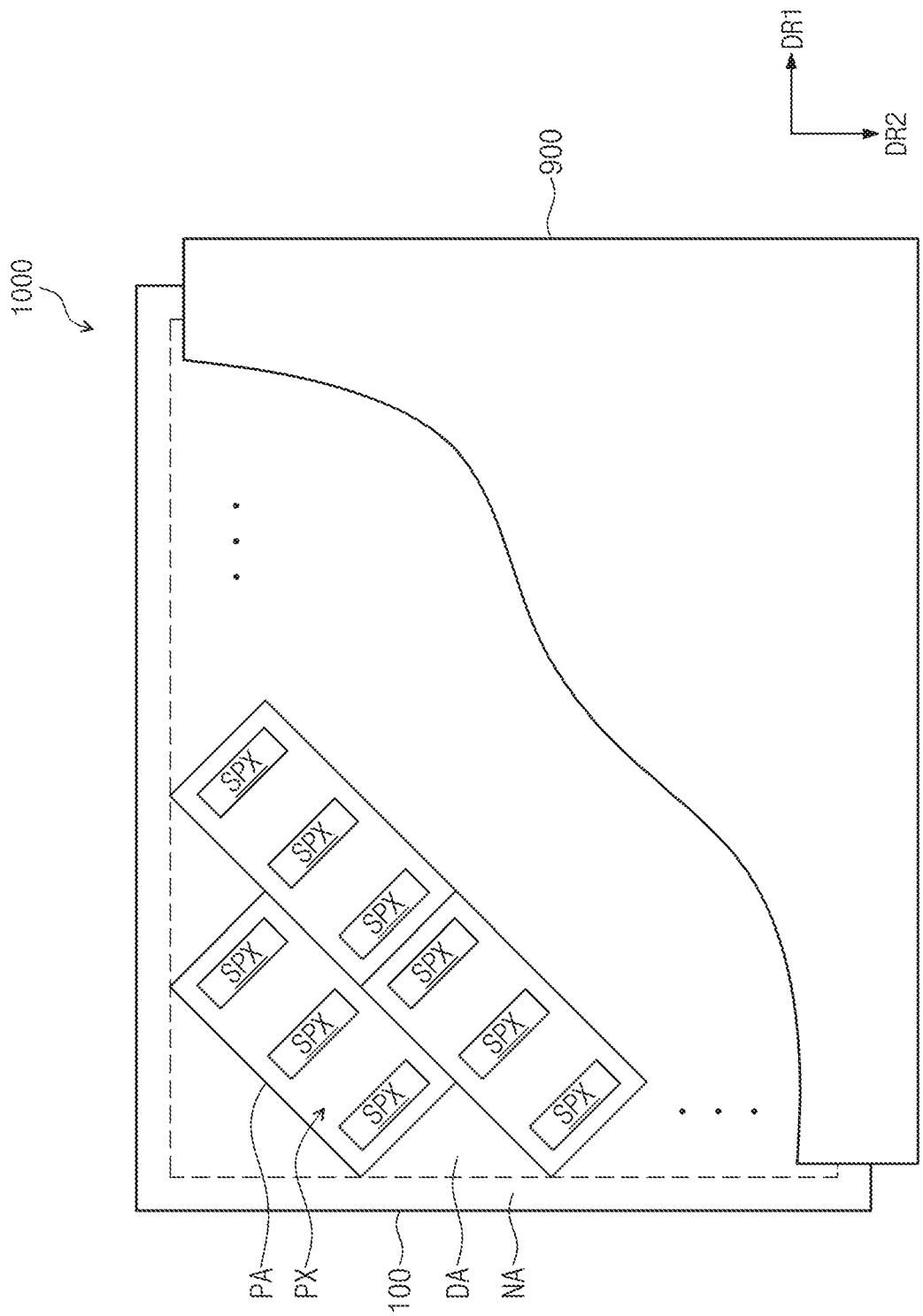
FIG. 1 is a plan view of a display panel according to one or more exemplary embodiments of the present disclosure.

Hereinafter, example embodiments are described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, the present invention is explained with reference to the accompanying drawings.

Figure 2:
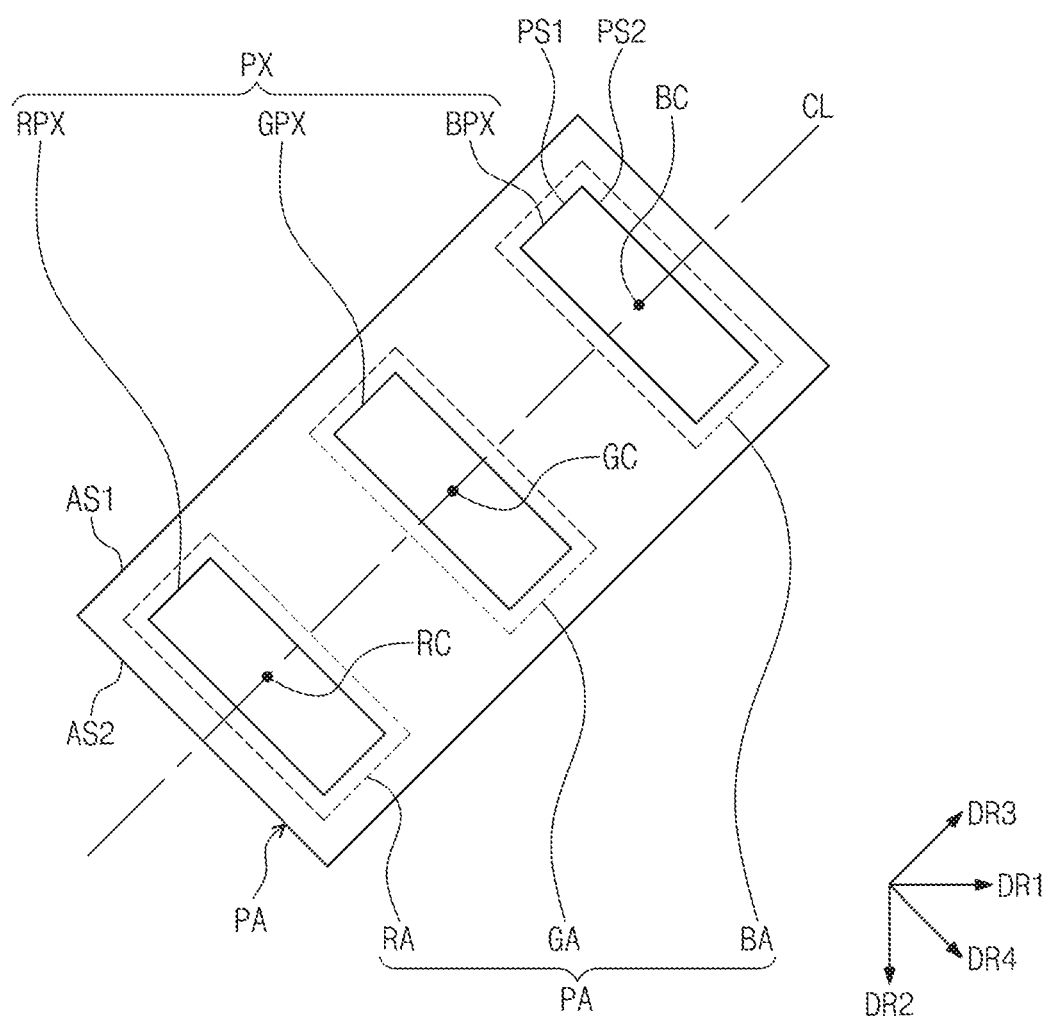
FIG. 2 is a plan view of a pixel of FIG. 1.

FIG. 1 is a plan view of a display panel 1000 according to one or more exemplary embodiments of the present disclosure and FIG. 2 is a plan view of a pixel shown in FIG. 1.

Referring to FIG. 1, in one or more embodiments, the display panel 1000 includes a lower substrate 100, an upper substrate 900 facing the lower substrate 100, and a plurality of pixels PX disposed between the lower substrate 100 and the upper substrate 900.

The lower substrate 100 includes a display area (or display part) DA for displaying an image (e.g., a display area DA that is configured to display an image) and a non-display area (or non-display part) NA not displaying the image (e.g., a non-display area NA that is not configured to display an image). The display area DA includes a plurality of pixel areas PA defined therein. The non-display area NA may be adjacent to at least one side of the display area DA. For example, the non-display area NA may be disposed to surround the display area DA. The non-display area NA includes lines or drivers, which are arranged in the non-display area NA to drive the pixels PX.

The lower substrate 100 may be a flexible substrate, but the present disclosure is not limited thereto. The lower substrate 100 may include a polymer with superior heat resistance and superior durability, such as polyethylene terephthalate, polyethylene naphthalate, polycarbonate, polyarylate, polyether imide, polyether sulfone, polyimide, polymethyl methacrylate, etc., and/or a combination thereof, but the present disclosure is not limited thereto or thereby. The lower substrate 100 may include various materials, e.g., metal or glass.

The pixels PX are disposed to respectively correspond to the pixel areas PA. Each pixel PX serves as a basic element for displaying a unit image (e.g., a basic element configured to display a unit image). The display panel 1000 has a resolution determined by the number of pixels PX arranged on the lower substrate 100. The pixels PX are arranged in a matrix form along a first direction DR1 and a second direction DR2 that is substantially perpendicular to the first direction DR1. For convenience of explanation, FIG. 1 illustrates three pixels PX adjacent to each other and additional pixels PX are omitted.

Each of the pixels PX may include a plurality of sub-pixels SPX. For example, each of the pixels PX may include three sub-pixels SPX, but the present disclosure is not limited thereto or thereby. For example, each of the pixels PX may include two or four or more sub-pixels SPX.

Each sub-pixel SPX may be configured to display a color (e.g., a primary color). Each sub-pixel SPX may be configured to display one of red, green, blue, and white colors, but the present disclosure is not limited thereto or thereby. For example, the sub-pixels SPX may be configured to display one of yellow, cyan, and magenta colors.

Referring to FIG. 2, the pixel area PA includes a first side (e.g., a first area side AS1) that is substantially parallel to a third direction DR3, which is different from the first and second directions DR1 and DR2 (e.g., which intersects or is not parallel to the first and second directions DR1 and DR2), and a second side (e.g., a second area side AS2) that is substantially parallel to a fourth direction DR4, which is different from the first and second directions DR1 and DR2 (e.g., which intersects or is not parallel to the first and second directions DR1 and DR2). For example, the pixel area PA may have a substantially rectangular shape. As such, an included angle between the first and third directions DR1 and DR3 may be about 45 degrees and the third and fourth directions DR3 and DR4 may be substantially perpendicular to each other. The first and second area sides AS1 and AS2 may be long and short sides of the pixel area PA, respectively. The first area side AS1 may have a length that is two times greater than a length of the second area side AS2.

The pixel area PA may include a plurality of color areas. For example, the color areas may include a red area RA, a green area GA, and a blue area BA.

The red, green, and blue areas RA, GA, and BA are arranged along the third direction DR3 and spaced apart from each other (e.g., spaced apart from each other by a predetermined distance). For example, a red area center RC of the red area RA, a green area center of the green area GA, and a blue area center BC of the blue area BA each overlap with a center line CL that is substantially parallel to the third direction DR3. The red, green, and blue areas RA, GA, and BA are not overlapped with each other.

The pixel PX includes red, green, and blue sub-pixels RPX, GPX, and BPX, which are respectively for displaying red, green, and blue images. The red, green, and blue sub-pixels RPX, GPX, and BPX are disposed to respectively correspond to the red, green, and blue areas RA, GA, and BA. In other words, the red, green, and blue sub-pixels RPX, GPX, and BPX are disposed such that the centers of the red, green, and blue sub-pixels RPX, GPX, and BPX are on the center line CL.

Each of the red, green, and blue sub-pixels RPX, GPX, and BPX includes a first pixel side PS1 and a second pixel side PS2, which are substantially parallel to the third and fourth directions DR3 and DR4, respectively. The first and second pixel sides PS1 and PS2 may respectively be a short side and a long side of the red, green, and blue sub-pixels RPX, GPX, and BPX. As illustrated in FIG. 2, each of the red, green, and blue sub-pixels RPX, GPX, and BPX may have a substantially quadrangular shape, but the present disclosure is not limited thereto or thereby. For example, each of the red, green, and blue sub-pixels RPX, GPX, and BPX may have any suitable shape, such as a polygonal shape, a circular shape, an oval shape, etc.

As an example, in one or more embodiments, the second pixel sides PS2 of the red, green, and blue sub-pixels RPX, GPX, and BPX may have the same length and the first pixel sides PS1 of the red, green, and blue sub-pixels RPX, GPX, and BPX may have different lengths. Because the red, green, and blue sub-pixels RPX, GPX, and BPX have a similar structure, hereinafter, the red sub-pixel RPX is described as a representative example.

Figure 3:
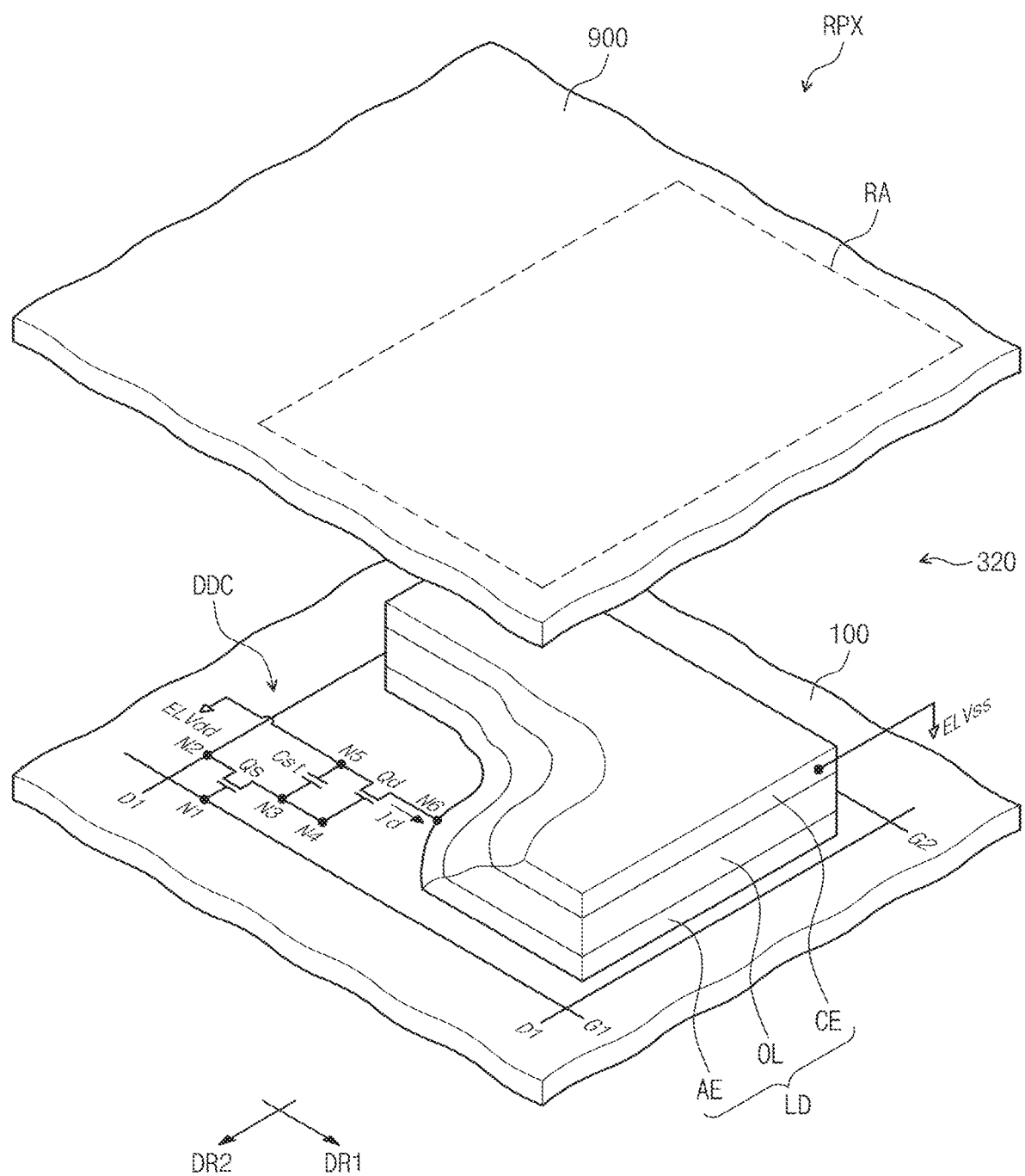
FIG. 3 is an exploded perspective view of a red sub-pixel of FIG. 2.

FIG. 3 is an exploded perspective view of the red sub-pixel RPX shown in FIG. 2.

Referring to FIG. 3, in one or more embodiments, the red sub-pixel RPX may include an organic light emitting device LD and a device driving circuit DDC. The organic light emitting device LD and the device driving circuit DDC are disposed between the lower substrate 100 and the upper substrate 900 to correspond to the red area RA.

The red sub-pixel RPX may include a barrier layer to prevent or substantially prevent a foreign substance, e.g., moisture, oxygen, etc., from infiltrating the organic light emitting device LD. The barrier layer encapsulates the organic light emitting device LD to prevent or substantially prevent the organic light emitting device LD from being exposed to the outside.

For example, the barrier layer may be an encapsulation member that attaches the lower substrate 100, the upper substrate 900, and the lower and upper substrates 100 and 900 or may be a thin film encapsulation layer that covers the organic light emitting device LD. The thin film encapsulation layer may have a single-layer structure of an organic or inorganic layer or a multi-layer structure of organic and inorganic layers.

The lower substrate 100 may include a plurality of gate lines and a plurality of data lines. FIG. 3 illustrates first and second gate lines G1 and G2 among the gate lines and first and second data lines D1 and D2 among the data lines. The gate lines G1 and G2 are insulated from the data lines D1 and D2 while crossing the data lines D1 and D2. The gate lines G1 and G2 extend in the first direction DR1 and the data lines D1 and D2 extend in the second direction DR2, but the present disclosure is not limited thereto or thereby. For example, portions of the gate lines G1 and G2 and the data lines D1 and D2 may have a bent shape as long as the gate lines G1 and G2 are insulated from and cross the data lines D1 and D2. An area surrounded by the gate lines G1 and G2 and the data lines D1 and D2 may correspond to the red area RA.

In one or more embodiments, the device driving circuit DDC includes a switching transistor Qs, a driving transistor Qd, and a storage capacitor Cst.

The switching transistor Qs may include a control terminal N1, an input terminal N2, and an output terminal N3. The control terminal N1 is connected to the first gate line G1, the input terminal N2 is connected to the first data line D1, and the output terminal N3 is connected to the driving transistor Qd. The switching transistor Qs applies a data voltage, which is applied to the first data line D1, to the driving transistor Qd in response to a gate signal applied to the first gate line G1.

The driving transistor Qd may include a control terminal N4, an input terminal N5, and an output terminal N6. The control terminal N4 is connected to the output terminal N3 of the switching transistor Qs, the input terminal N5 receives a driving voltage ELVdd (e.g., is configured to receive a driving voltage ELVdd), and the output terminal N6 is connected to the organic light emitting device LD. The driving transistor Qd applies an output current Id, which has a level that varies depending on a voltage between the control terminal N4 and the output terminal N6, to the organic light emitting device LD.

The storage capacitor Cst is connected between the output terminal N3 of the switching capacitor Qs and the input terminal N5 of the driving transistor Qd. The storage capacitor Cst is charged with a voltage applied to the control terminal N4 of the driving transistor Qd and maintains the voltage charged therein during a predetermined time period after the switching transistor Qs is turned off.

The lower substrate 100 may further include a driving voltage line. The driving voltage line may extend substantially parallel to the first gate line G1 or extends substantially parallel to the first data line D1. The driving voltage line receives the driving voltage ELVdd and is connected to the input terminal N5 of the driving transistor Qd.

In one or more embodiments, the organic light emitting device LD may include a first electrode AE, an organic layer OL, and a second electrode CE.

In one or more embodiments, the first electrode AE is an anode electrode and the second electrode CE is a cathode electrode. The first electrode AE is connected to the output terminal N6 of the driving transistor Qd and provides the organic layer OL with holes. The second electrode CE receives a common voltage ELVss and provides the organic layer OL with electrons. The organic layer OL is disposed between the first electrode AE and the second electrode CE. The organic layer OL may include a plurality of layers and an organic material.

The holes are injected into the organic layer OL from the first electrode AE and the electrons are injected into the organic layer OL. Holes and electrons injected into the organic layer OL are recombined in the organic layer OL to generate excitons, and the organic layer OL emits the light by the excitons that return to a ground state from an excited state. The light emitted from the organic layer OL has an intensity determined by the output current Id flowing through the output terminal N6 of the driving transistor Qd.

As illustrated in FIG. 3, in some embodiments, the second electrode CE may be disposed on the first electrode AE, but the present disclosure is not limited thereto or thereby. For example, in some embodiments, the first electrode AE may be disposed on the second electrode CE.

An inner space 320 defined by the lower substrate 100 and the upper substrate 900 may be maintained in a vacuum state, but the present disclosure is not limited thereto or thereby. For example, the inner space 320 may be filled with an inert gas such as a nitrogen gas ($N_2$) or with a filling member including an insulating material.

The organic light emitting device LD may include an optical compensation layer. The optical compensation layer scatters the light emitted from the organic layer OL such that the light emitted from the organic layer OL has a wide output angle or improves a light extraction efficiency of the organic light emitting device LD.

Figure 4:
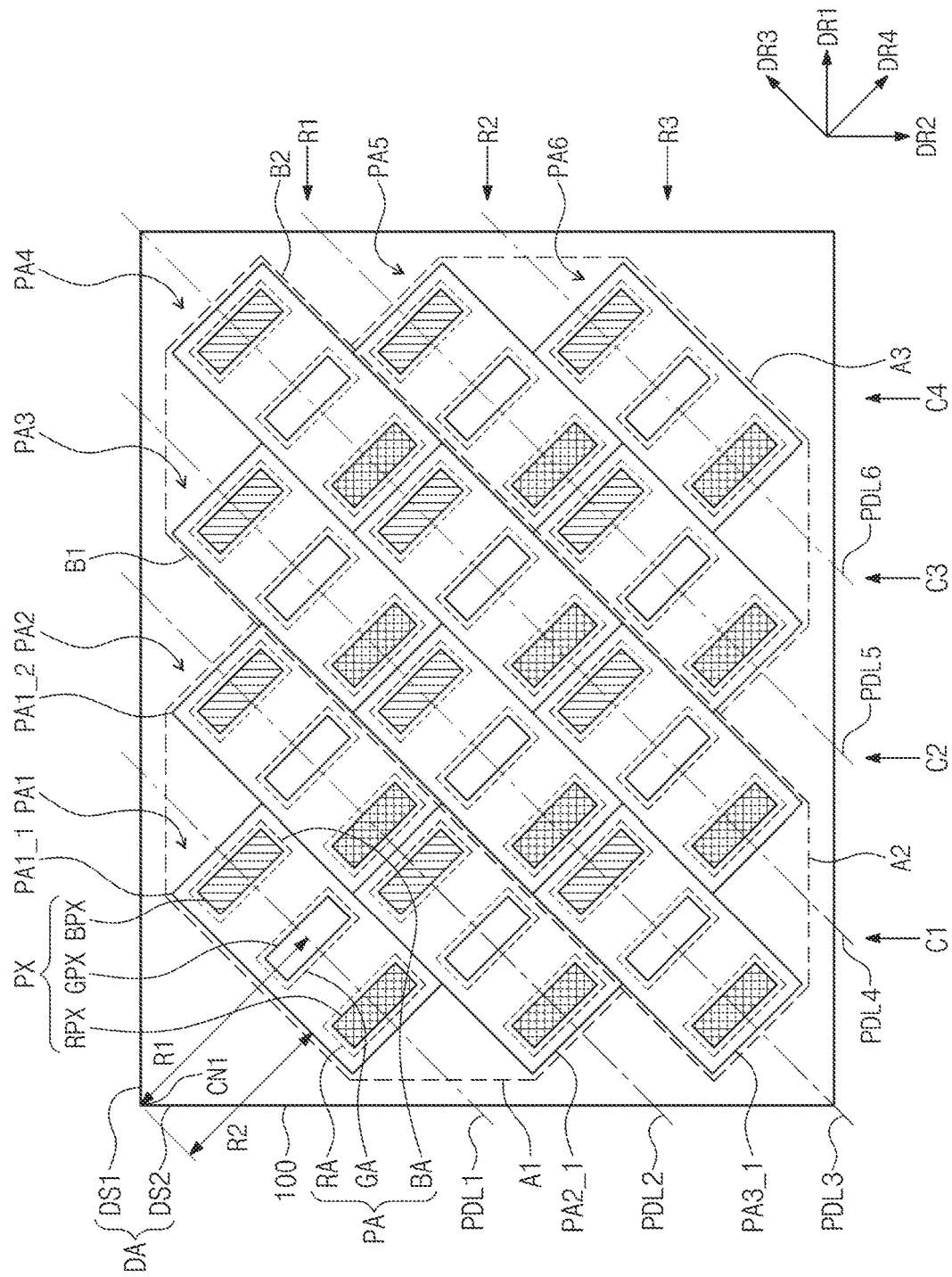
FIG. 4 is a plan view of a pixel area according to one or more exemplary embodiments of the present disclosure.

FIG. 4 is a plan view of a pixel area according to one or more exemplary embodiments of the present disclosure.

Referring to FIG. 4, in one or more embodiments, the pixel areas PA are defined on the lower substrate 100 with respect to first and second display sides DS1 and DS2 of the display area DA. The first and second display sides DS1 and DS2 are substantially parallel to the first and second directions DR1 and DR2, respectively.

The pixel areas PA are arranged in a matrix form along first to third rows R1 to R3 and first to fourth columns C1 to C4. Hereinafter, for convenience of explanation, a pixel area disposed at an m-th row and an n-th column among the pixel areas PA is referred to as an "m-th row and n-th column pixel area PAm_n". For example, among the pixel areas PA, a pixel area disposed at a second row and a second column is referred to as a "second-row and second-column pixel area PA2_2".

The pixel areas PA are divided into six areas: a first pixel area PA1, a second pixel area PA2, a third pixel area PA3, a fourth pixel area PA4, a fifth pixel area PA5 and a sixth pixel area PA6. The first to sixth pixel areas PA1 to PA6 are overlapped with first to sixth pixel definition lines PDL1 to PDL6, respectively.

The first to sixth pixel definition lines PDL1 to PDL6 are defined on the display area DA and are substantially parallel to the third direction DR3. In addition, the first to sixth pixel definition lines PDL1 to PDL6 are sequentially arranged in the fourth direction DR4 and spaced apart (e.g., spaced apart from each other by a predetermined distance). For example, a first-row and first-column pixel area PA1_1 is included in the first pixel area PA1, and a first-row and second-column pixel area PA1_2 and a second-row and first-column pixel area PA2_1 are included in the second pixel area PA2.

The first to sixth pixel definition lines PDL1 to PDL6 are defined with respect to the first and second display sides DS1 and DS2. In more detail, the first pixel definition line PDL1 is spaced apart from a first corner CN1 defined by the first and second display sides DS1 and DS2 by a first reference distance R1.

Similarly, the first to sixth pixel areas PA1 to PA6 are defined with respect to the first and second display sides DS1 and DS2. In more detail, the first-row and first-column pixel area PA1_1 is spaced apart from the first corner CN1 by a second reference distance R2.

First, second, and third areas A1, A2, and A3 are defined on the lower substrate 100. The first to third areas A1 to A3 are sequentially defined in the fourth direction D4 on the lower substrate 100. A first boundary line B1 is defined between the first and second areas A1 and A2 and a second boundary line B2 is defined between the second and third areas A2 and A3. The first and second boundary lines B1 and B2 are substantially parallel to the third direction DR3.

The first and second pixel areas PA1 and PA2 are included in the first area A1, the third and fourth pixel areas PA3 and PA4 are included in the second area A2, and the fifth and sixth pixel areas PA5 and PA6 are included in the third area A3.

As an example, in one or more embodiments, a number of the first pixel areas PA1 is one and a number of the second pixel areas PA2 is two. That is, the number of the first pixel areas PA1 included in the first area A1 is less than the number of the second pixel areas PA2 included in the first area A1.

In addition, a number of the third pixel areas PA3 is three and a number of the fourth pixel areas PA2 is three. That is, the number of the third pixel areas PA3 included in the second area A2 is equal to the number of the fourth pixel areas PA2 included in the second area A2.

Further, a number of the fifth pixel areas PA5 is two and a number of the sixth pixel areas PA6 is one. That is, the number of the fifth pixel areas PA5 included in the third area A3 is greater than the number of the sixth pixel areas PA6 included in the third area A3.

Figure 5:
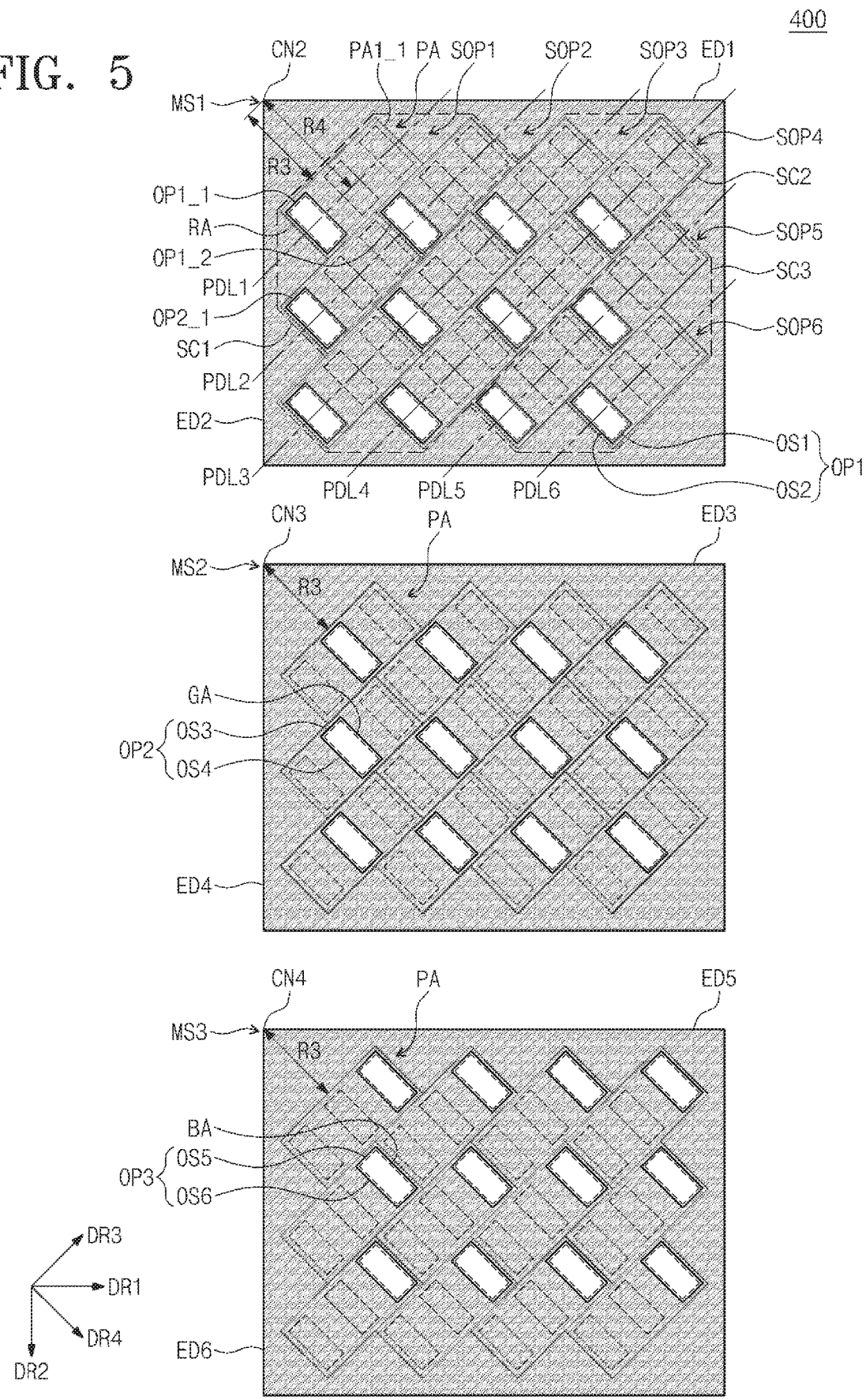
FIG. 5 is a plan view of a mask set according to one or more exemplary embodiments of the present disclosure.

FIG. 5 is a plan view of a mask set 400 according to one or more exemplary embodiments of the present disclosure.

Referring to FIG. 5, the mask set 400 includes first, second, and third masks MS1, MS2, and M3.

The first mask MS1 includes a first edge ED1, a second edge ED2, and a plurality of first openings OP1.

The first and second edges ED1 and ED2 are substantially parallel to the first and second directions DR1 and DR2, respectively.

Pixel areas PA (e.g., pixel areas PA that correspond to the pixel areas PA of the display panel 1000) are defined on the first mask MS1. The pixel areas PA are defined by the first and second edges ED1 and ED2. In more detail, the first-row and first-column pixel area PA1_1 is spaced apart from a second corner CN2 formed by the first and second edges ED1 and ED2 by a third reference distance R3. The third reference distance R3 may be greater than the second reference distance R2 (refer to FIG. 4).

The first openings OP1 are formed to respectively correspond to the red areas RA of the pixel areas PA of the display panel 1000. The first openings OP1 include first and second opening sides OS1 and OS2 that are substantially parallel to the third and fourth directions DR3 and DR4, respectively. The first openings OP1 may have a quadrangular shape corresponding to the red area RA. The first and second opening sides OS1 and OS2 may be a short side and a long side of the first openings OP1, respectively.

In more detail, the first openings OP1 are arranged in a matrix form along the first and second directions DR1 and DR2. Hereinafter, for convenience of explanation, a first opening disposed at an m-th row and an n-th column among the first openings OP1 is referred to as an "m-th row and n-th column first opening OPm_n". For example, among the first openings OP1, a first opening disposed at a second row and a first column is referred to as a "second-row and first-column first opening OP2_1".

The first openings OP1 are divided into six sub-openings: a first sub-opening SOP1, a second sub-opening SOP2, a third sub-opening SOP3, a fourth sub-opening SOP4, a fourth sub-opening SOP4, a fifth sub-opening SOP5, and a sixth sub-opening SOP6. Among the first openings OP1, the first to sixth sub-openings SOP1 to SOP6 are overlapped with the first to sixth pixel definition lines PDL1 to PDL6, respectively. For example, the first sub-opening SOP1 includes a first-row and first-column first opening OP1_1 and the second sub-opening SOP2 includes a first-row and second-column first opening OP1_2 and the second-row and first-row first opening OP2_1.

The first to sixth pixel definition lines PDL1 to PDL6 are defined on the first mask MS1 by the first and second edges ED1 and ED2. In more detail, the first pixel definition line PDL1 is spaced apart from the second corner CN2 formed by the first and second edges ED1 and ED2 by a fourth reference distance R4.

The first mask MS1 includes first, second, and third sections SC1, SC2, and SC3. The first to third sections SC1 to SC3 respectively correspond to the first to third areas A1 to A3.

In more detail, the first to third sections SC1 to SC3 are sequentially arranged in the fourth direction DR4 on the lower substrate 100. A first section boundary line is defined between the first and second sections SC1 and SC2 and a second section boundary line is defined between the second and third sections SC2 and SC3. The first and second section boundary lines are substantially parallel to the third direction DR3.

The first and second sub-openings SOP1 and SOP2 are formed in the first section SC1, the third and fourth sub-openings SOP3 and SOP4 are formed in the second section SC2, and the fifth and sixth sub-openings SOP5 and SOP6 are formed in the third section SC3.

As an example, a number of the first sub-openings SOP1 may be one and a number of the second sub-openings SOP2 may be two. That is, the number of the first sub-openings SOP1 included in the first section SC1 is less than the number of the second sub-openings SOP2 included in the first section SC1.

In addition, a number of the third sub-openings SOP3 may be three and a number of the fourth sub-openings SOP4 may be three. That is, the number of the third sub-openings SOP3 included in the second section SC2 is equal to the number of the fourth sub-openings SOP4 included in the second section SC2.

Further, a number of the fifth sub-openings SOP5 may be two and a number of the sixth sub-openings SOP6 may be one. That is, the number of the fifth sub-openings SOP5 included in the third section SC3 is greater than the number of the sixth sub-openings SOP6 included in the third section SC3.

As described above, when the first openings OP1 are formed on the first mask MS1, strength of the first mask MS1 may be improved. Accordingly, the size of each first opening OP1 may be relatively large in order to improve transmittance of the sub-pixel SPX (refer to FIG. 1) or the density of the first openings OP1 may become high in order to improve the resolution of the display panel 1000 (refer to FIG. 1).

The second mask MS2 includes a third edge ED3, a fourth edge ED4, and a plurality of second openings OP2. The second mask MS2 has a structure and a function that are substantially the as those of the first mask MS1 except that the second mask MS2 includes the second openings OP2 instead of the first openings OP1.

The third and fourth edges ED3 and ED4 are substantially parallel to the third and fourth directions DR3 and DR4, respectively.

Pixel areas PA (e.g., pixel areas PA that correspond to the pixel areas PA of the display panel 1000 and the first mask MS1) are defined on the second mask MS2. The pixel areas PA are defined by the third and fourth edges ED3 and ED4. In more detail, the first-row and first-column pixel area PA1_1 is spaced apart from a third corner CN3 formed by the third and fourth edges ED3 and ED4 by the third reference distance R3.

The second openings OP2 are formed to respectively correspond to the green areas GA of the pixel areas PA of the display panel 1000. The second openings OP2 include third and fourth opening sides OS3 and OS4 that are substantially parallel to the third and fourth directions DR3 and DR4, respectively. Each of the second openings OP2 may have a quadrangular shape corresponding to the green area GA. The third and fourth opening sides OS3 and OS4 may be a short side and a long side of the second openings OP2, respectively.

The structure and function of the second openings OP2 are substantially the same as those of the first openings OP1 except that the second openings OP2 are disposed to correspond to the green areas GA of the pixel areas PA of the display panel 1000 instead of the red areas RA, and thus additional description thereof is omitted to avoid redundancy.

The third mask MS3 includes a fifth edge ED5, a sixth edge ED6, and a plurality of third openings OP3. The structure and function of the third mask MS3 are substantially the same as those of the first mask MS1 except that the third mask MS3 includes third openings OP3 instead of the first openings OP1.

The fifth and sixth edges ED5 and ED6 are substantially parallel to the third and fourth directions DR3 and DR4, respectively.

Pixel areas PA (e.g., pixel areas PA that correspond to the pixel areas PA of the display panel 1000, first mask MS1, and second mask MS2) may be defined on the third mask MS3. The pixel areas PA are defined by the fifth and sixth edges ED5 and ED6. In more detail, the first-row and first-column pixel area PA1_1 is spaced apart from a fourth corner CN4 formed by the fifth and sixth edges ED5 and ED6 by the third reference distance R3.

The third openings OP3 are formed to respectively correspond to the blue areas BA of the pixel areas PA. The third openings OP3 include fifth and sixth opening sides OS5 and OS6 substantially parallel to the third and fourth directions DR3 and DR4. Each of the third openings OP3 may have a quadrangular shape corresponding to the blue area BA. The fifth and sixth opening sides OS5 and OS6 may be a short side and a long side of the third openings OP3, respectively.

The structure and function of the third openings OP3 are substantially the same as the structure and function of the first openings OP1 except that the third openings OP3 are disposed to correspond to the blue areas BA of the pixel areas PA instead of the red areas RA, and thus additional description thereof is omitted to avoid redundancy.

As an example, the second, fourth, and sixth opening sides OS2, OS4, and OS6 may have the same length, and the length of the first opening side OS1 may be different from at least one of the third and fifth openings OS3 and OS5.

Figure 6:
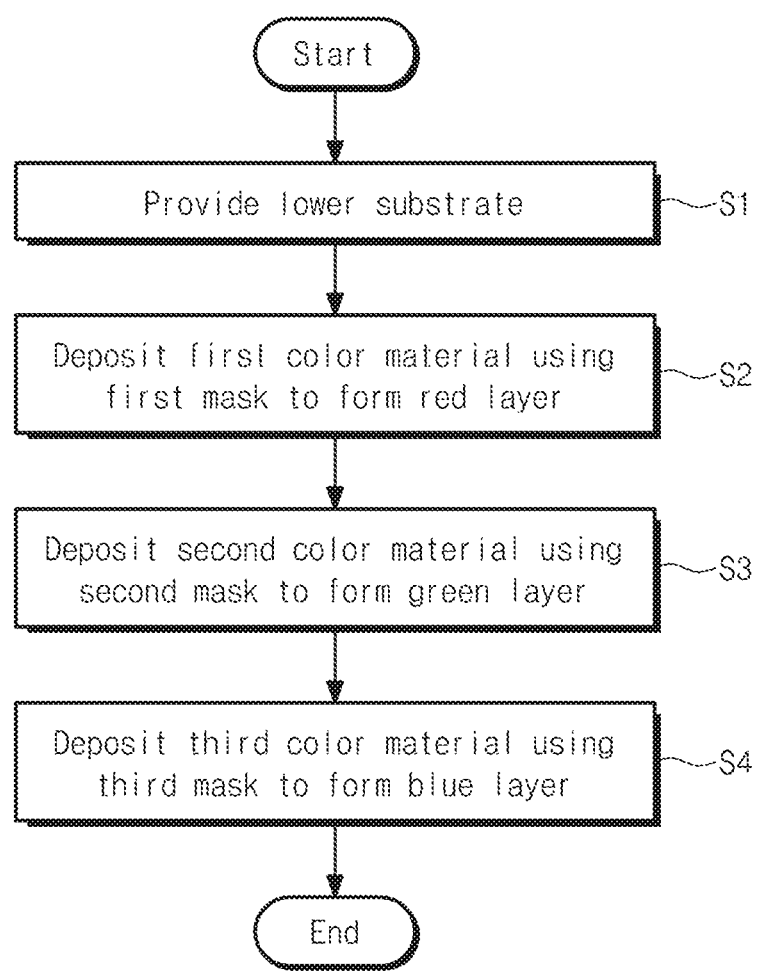
FIG. 6 is a flowchart of a method of manufacturing a display panel using the mask set of FIG. 5.
Figure 7:
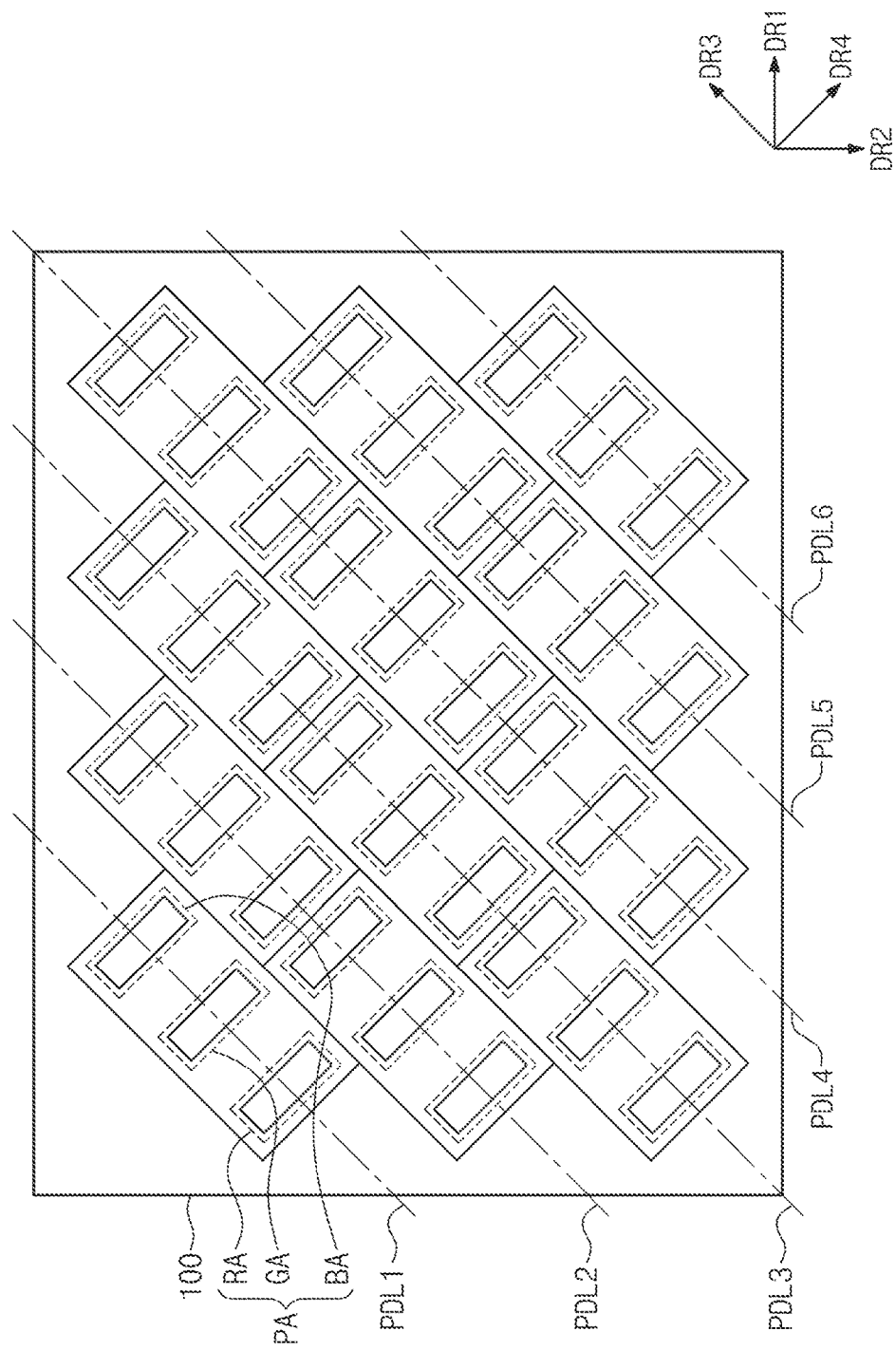
FIG. 7 is a plan view of a lower substrate according to the manufacturing method of FIG. 6.
Figure 8:
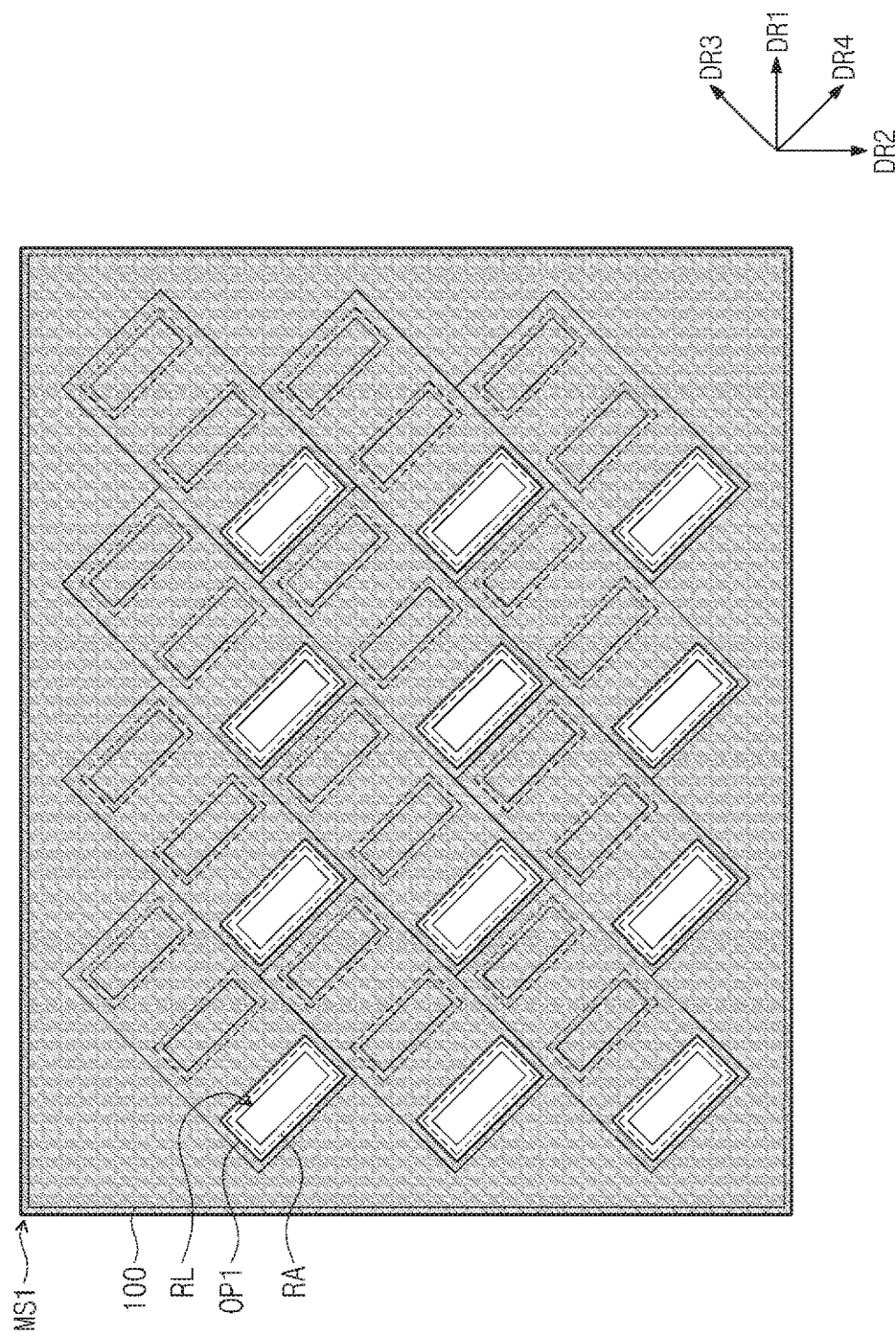
FIG. 8 is a plan view of the lower substrate and a first mask for depositing a first color material according to the manufacturing method of FIG. 6.
Figure 9:
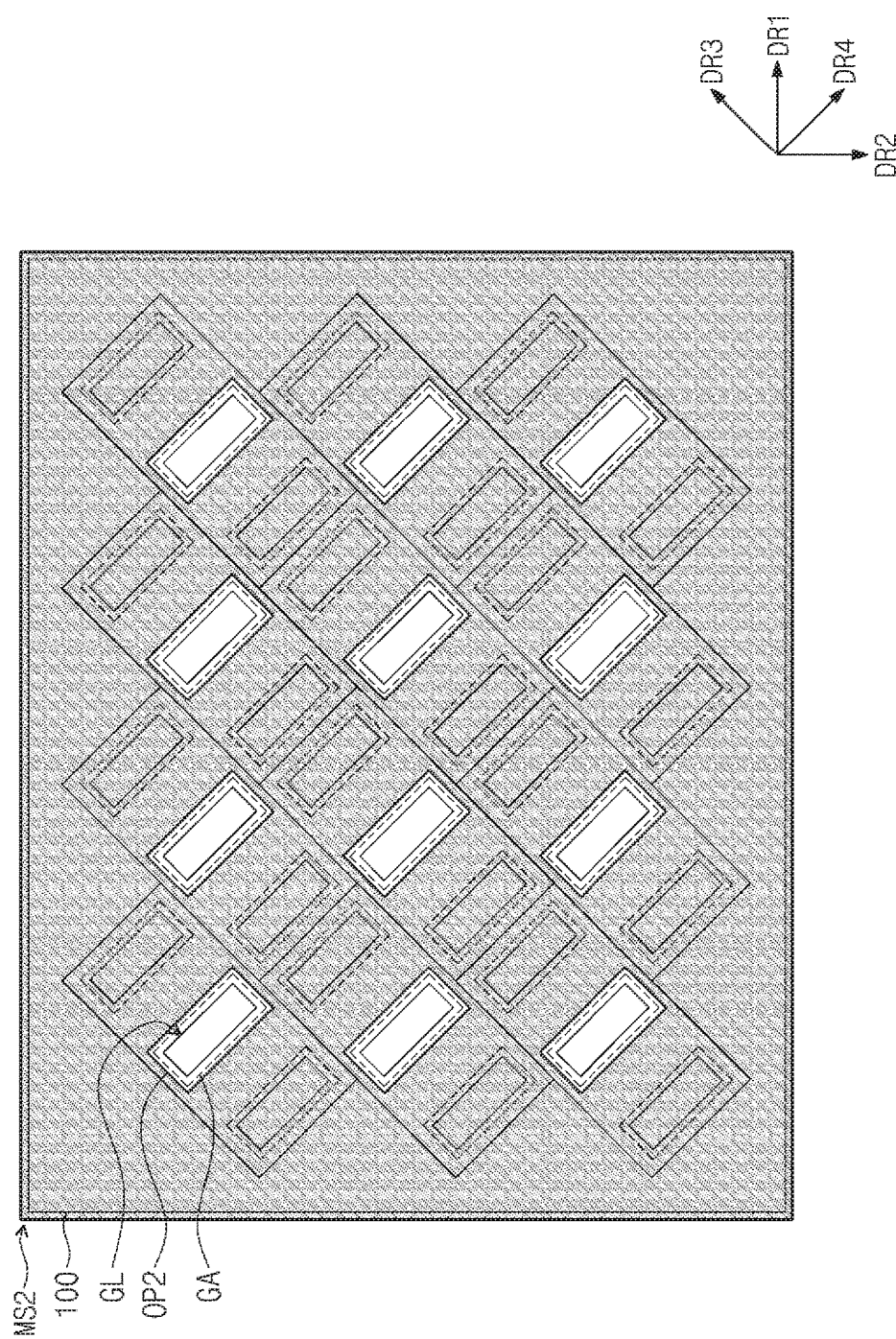
FIG. 9 is a plan view of the lower substrate and a second mask for depositing a second color material according to the manufacturing method of FIG. 6.
Figure 10:
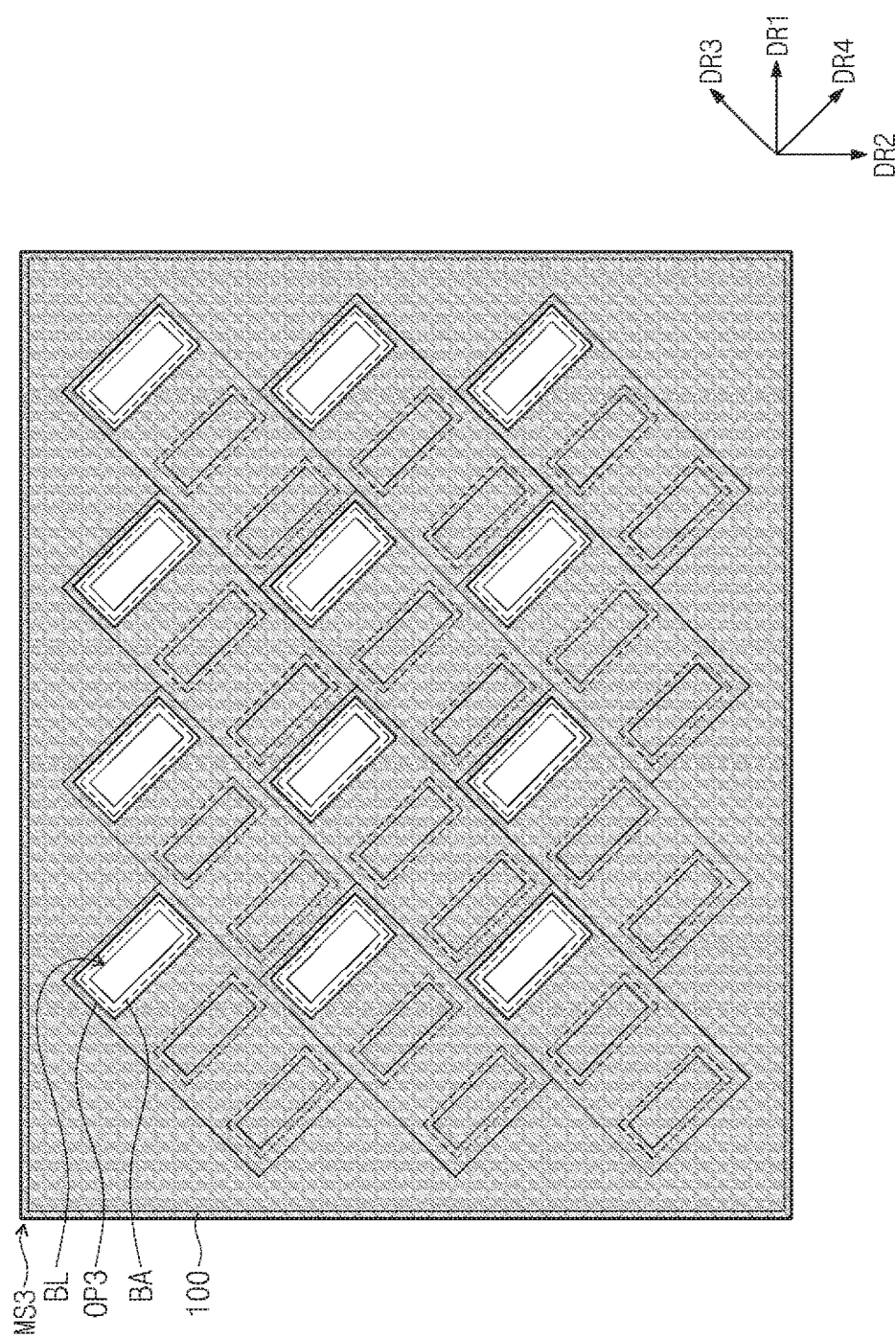
FIG. 10 is a plan view of the lower substrate and a third mask for depositing a third color material according to the manufacturing method of FIG. 6.
Figure 11:
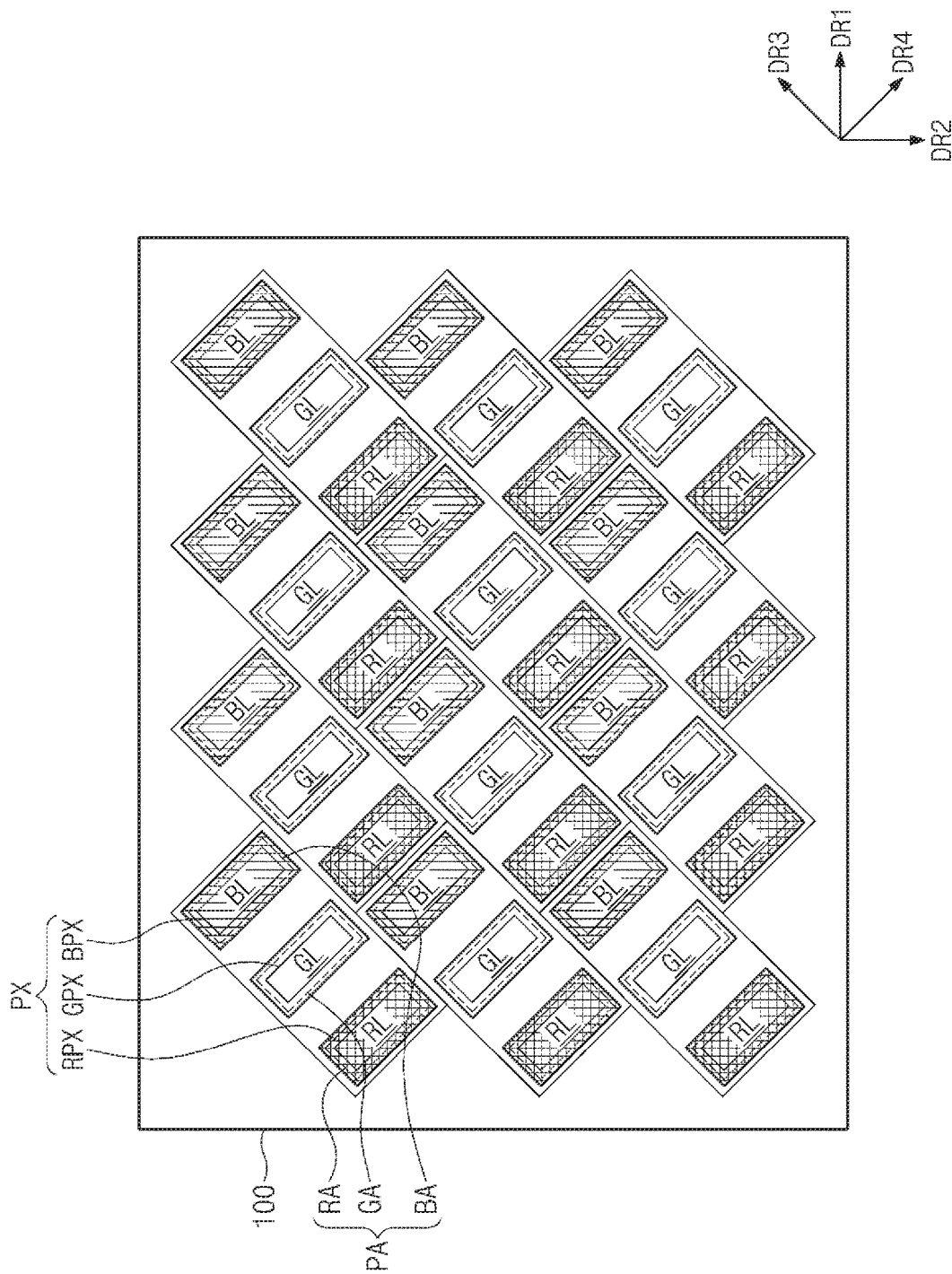
FIG. 11 is a plan view of a display panel manufactured by the manufacturing method of FIG. 6.

FIG. 6 is a flowchart of a method of manufacturing a display panel using the mask set of FIG. 5, FIG. 7 is a plan view of a lower substrate according to the manufacturing method of FIG. 6, FIG. 8 is a plan view of the lower substrate and a first mask for depositing a first color material according to the manufacturing method of FIG. 6, FIG. 9 is a plan view of the lower substrate and a second mask for depositing a second color material according to the manufacturing method of FIG. 6, FIG. 10 is a plan view of the lower substrate and a third mask for depositing a third color material according to the manufacturing method of FIG. 6, and FIG. 11 is a plan view of a display panel manufactured according to the manufacturing method of FIG. 6.

Referring to FIGS. 6 and 7, the lower substrate 100 is provided (S1). The pixel areas PA1 to PA6 and the pixel definition lines PDL1 to PDL6 are defined in the lower substrate 100.

Then, as shown in FIG. 8, the first color material is deposited on the lower substrate 100 using the first mask MS1 (S2). In more detail, the first mask MS1 is aligned on the lower substrate 100 to allow the first openings OP1 to overlap with the red areas RA defined on the lower substrate 100.

When the first mask MS1 is aligned, a shadow masking process is carried out using the first mask MS1 to deposit the first color material on the lower substrate 100. In more detail, the first mask MS1 is interposed between the first color material and the lower substrate 100. The first color material is heated to be evaporated. The evaporated first color material moves to the lower substrate 100. Only a portion of the evaporated first color material is deposited on the red areas RA through the first openings OP1, and thus a red layer RL is formed in the red areas RA.

As an example, the first color material may be an organic light emitting material that emits red light, but the present disclosure is not limited thereto, and the red layer RL may be a red organic light emitting layer for the red sub-pixel RPX (refer to FIG. 2), but the present disclosure is not limited thereto.

Referring to FIG. 9, the first mask MS1 is removed and the second color material is deposited on the lower substrate 100 using the second mask MS2 (S3). As such, the second mask MS2 is aligned on the lower substrate 100 to allow the second openings OP2 to overlap with the green areas GA defined on the lower substrate 100.

When the second mask MS2 is aligned, a shadow masking process is carried out using the second mask MS2 to deposit the second color material on the lower substrate 100. In more detail, the second mask MS2 is interposed between the second color material and the lower substrate 100. The second color material is heated to be evaporated. The evaporated second color material moves to the lower substrate 100. Only a portion of the evaporated second color material is deposited on the green areas GA through the second openings OP2, and thus a green layer GL is formed in the green areas GA.

As an example, the second color material may be an organic light emitting material that emits green light, but the present disclosure is not limited thereto, and the green layer GL may be a green organic light emitting layer for the green sub-pixel GPX (refer to FIG. 2), but the present disclosure is not limited thereto.

Referring to FIG. 10, the second mask MS2 is removed and the third color material is deposited on the lower substrate 100 using the third mask MS3 (S4). As such, the third mask MS3 is aligned on the lower substrate 100 to allow the third openings OP3 to overlap with the blue areas BA defined on the lower substrate 100.

When the third mask MS3 is aligned, a shadow masking process is carried out using the third mask MS3 to deposit the third color material on the lower substrate 100. In more detail, the third mask MS3 is interposed between the third color material and the lower substrate 100. The third color material is heated to be evaporated. The evaporated third color material moves to the lower substrate 100. Only a portion of the evaporated third color material is deposited on the blue areas BA through the third openings OP3, and thus a blue layer BL is formed in the blue areas BA.

As an example, the third color material may be an organic light emitting material that emits blue light, but the present invention is not limited thereto, and the blue layer BL may be a blue organic light emitting layer for the blue sub-pixel BPX (refer to FIG. 2), but the present invention is not limited thereto.

Referring to FIG. 11, the red layer RL, the green layer GL, and the blue layer BL of the red, green, and blue sub-pixels RPX, GPX, and BPX are formed to respectively correspond to the red, green, and blue areas RA, GA, and BA of each of the pixel areas PA.

As described above, because the first to third masks MS1 to MS3 (refer to FIG. 5) have high strength, the density of the first to third openings OP1 to OP3 of the first to third masks MS1 to MS3 is high. Accordingly, when the deposition process is performed by using the first to third masks MS1 to MS3, the number of the pixels PX (refer to FIG. 1) may be increased.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof.

What is claimed is:

1. A method of manufacturing a display panel, the method comprising:
    preparing a substrate comprising a display part comprising first and second display sides that are substantially parallel to first and second directions, respectively;
    defining a plurality of pixel areas on the substrate, the pixel areas being arranged in a matrix form along the first and second directions, each of the pixel areas comprising first and second area sides that are substantially parallel to third and fourth directions, respectively, the third and fourth directions being not parallel to the first and second directions;
    depositing a first color material on the substrate using a first mask to form a first color layer in a first color area of each of the pixel areas; and
    depositing a second color material on the substrate using a second mask to form a second color layer in a second color area of each of the pixel areas,
    wherein the first mask comprises a first opening corresponding to the first color area of each of the pixel areas and comprises first and second opening sides substantially parallel to the third and fourth directions, respectively, and
    wherein the second mask comprises a second opening corresponding to the second color area and comprises third and fourth opening sides substantially parallel to the third and fourth directions, respectively.

2. The method of claim 1,
    wherein the second color area is adjacent to the first color area in the third direction.

3. The method of claim 2, further comprising depositing a third color material on the substrate using a third mask to form a third color layer in a third color area of each of the pixel areas, wherein the third mask comprises a third opening corresponding to the third color area and comprises fifth and sixth opening sides substantially parallel to the third and fourth directions, respectively, and
    wherein the third color area is adjacent to the second color area in the third direction.

4. The method of claim 1, wherein the substrate comprises a first area, a number of first pixel areas in the first area from among the pixel areas being smaller than a number of second pixel areas in the first area from among the pixel areas,
    wherein the first and second pixel areas are overlapped with first and second pixel definition lines, respectively, the first and second pixel definition lines being substantially parallel to the third direction and overlapped with the first area, and
    wherein the second pixel definition line is adjacent to the first pixel definition line in the fourth direction.

5. The method of claim 4, wherein the substrate comprises a second area adjacent to the first area in the fourth direction, a number of third pixel areas in the second area from among the pixel areas being equal to a number of fourth pixel areas in the second area from among the pixel areas,
    wherein the third and fourth pixel areas are overlapped with third and fourth pixel definition lines, respectively, the third and fourth pixel definition lines being substantially parallel to the third direction and overlapped with the second area, and
    wherein the fourth pixel definition line is adjacent to the third pixel definition line in the fourth direction.

6. The method of claim 5, wherein the substrate comprises a third area adjacent to the second area in the fourth direction, a number of fifth pixel areas in the third area from among the pixel areas being greater than a number of sixth pixel areas in the third area from among the pixel areas,
    wherein the fifth and sixth pixel areas are overlapped with fifth and sixth pixel definition lines, respectively, the fifth and sixth pixel definition lines being substantially parallel to the third direction and overlapped with the third area, and
    wherein the sixth pixel definition line is adjacent to the fifth pixel definition line in the fourth direction.

7. The method of claim 3, wherein the first to third color areas are not alternately arranged in the first and second directions.

* * * * *